United States Patent [19]

Mori

[11] 4,426,732
[45] Jan. 17, 1984

[54] RECEIVER HAVING A SURFACE ELASTIC WAVE HIGH FREQUENCY AMPLIFIER WITH A FREQUENCY-CONTROLLED PUMP OSCILLATOR

[75] Inventor: Masaharu Mori, Tokyo, Japan

[73] Assignee: Clarion Co., Ltd., Tokyo, Japan

[21] Appl. No.: 385,361

[22] Filed: Jun. 7, 1982

[30] Foreign Application Priority Data

Jun. 11, 1981 [JP] Japan ................................. 56-90649

[51] Int. Cl.³ .......................... H04B 1/26; H03L 7/00; H03F 7/00
[52] U.S. Cl. .................................. 455/263; 330/5.5; 331/9; 333/193; 455/208; 455/214; 455/311
[58] Field of Search ................. 455/75, 208, 214, 257, 455/259, 260, 307, 311, 340, 341, 263, 258, 264; 330/4.5, 4.6, 5.5; 358/195.1; 310/313 R; 331/9, 107 A; 333/150, 193

[56] References Cited

U.S. PATENT DOCUMENTS

| | | |
|---|---|---|
| 3,787,612 | 1/1974 | DeVries et al. .................. 358/195.1 |
| 3,809,931 | 5/1974 | White et al. ...................... 310/313 R |
| 3,936,751 | 2/1976 | Holmes et al. ....................... 455/214 |
| 3,962,652 | 6/1976 | Zarin et al. ............................. 331/9 |
| 4,055,816 | 10/1977 | Woskow .............................. 330/5.5 |
| 4,115,744 | 9/1978 | Lewis ............................... 331/107 A |
| 4,126,838 | 11/1978 | McCusker et al. ................. 358/188 |
| 4,288,765 | 9/1981 | Mikoshiba et al. .................. 330/5.5 |

Primary Examiner—Marc E. Bookbinder
Attorney, Agent, or Firm—Flynn, Thiel, Boutell & Tanis

[57] ABSTRACT

Receiver comprising at least two output means taking out electric signals corresponding to sound waves propagating in different directions in a surface elastic wave amplifier disposed in the high frequency amplifier stage, wherein phase difference or frequency difference between outputs of said output means is detected and frequency of pumping electric power applied to said surface elastic wave amplifier is controlled in response to output thus detected.

6 Claims, 8 Drawing Figures

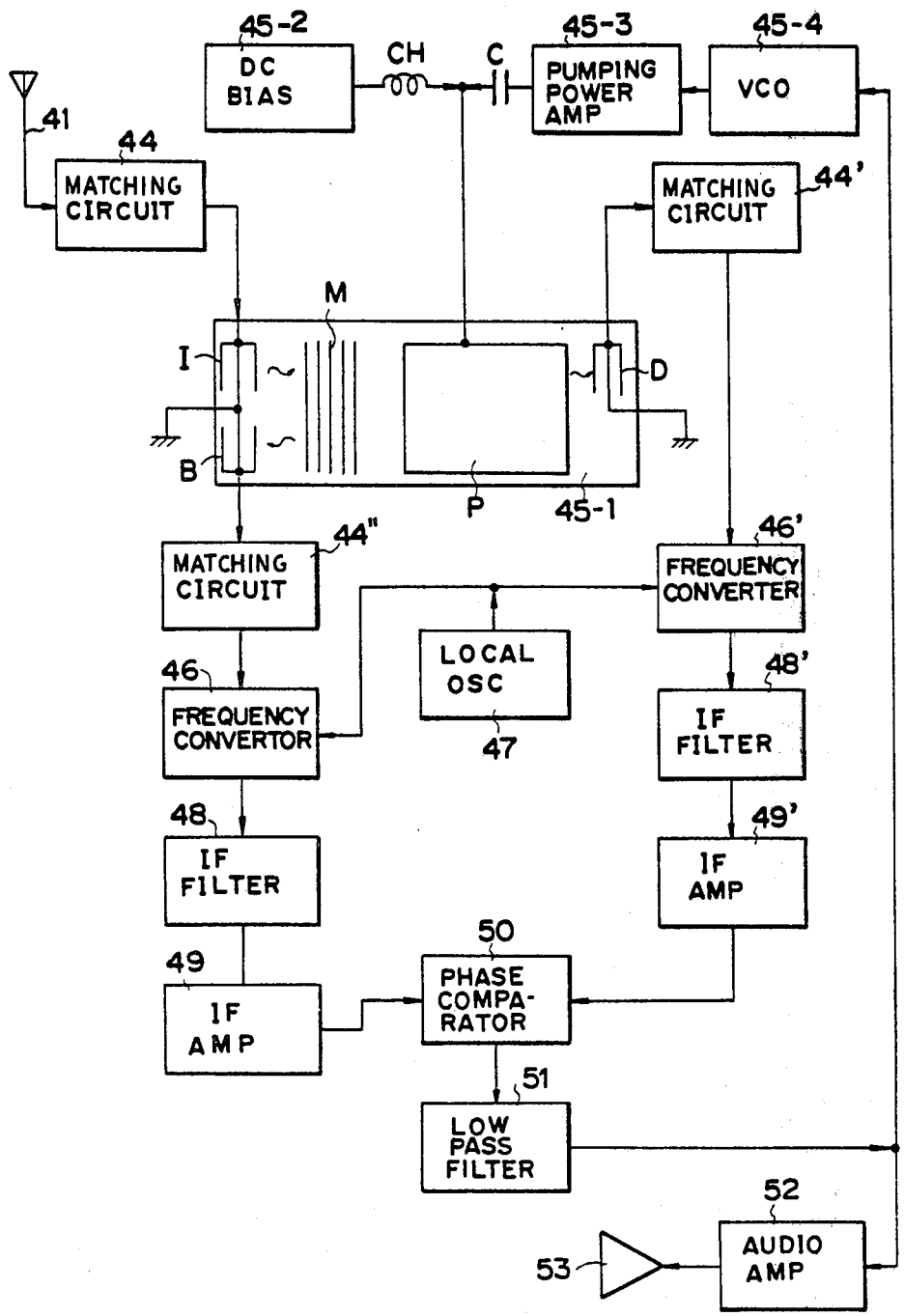

RECEIVER HAVING A SURFACE ELASTIC WAVE HIGH FREQUENCY AMPLIFIER WITH A FREQUENCY-CONTROLLED PUMP OSCILLATOR

BACKGROUND OF THE INVENTION

1. Field of the Invention

The present invention refers to a receiver, specifically to perfection of a receiver comprising a surface elastic wave amplifier having interference elimination characteristics and a high sensitivity.

2. Description of the Prior Art

As well known, performances required for wireless receivers can be divided into four categories, i.e. sensitivity, interference elimination, fidelity and stability. It is said that a receiver satisfying all these four performances is good, but recently, above all, interference elimination characteristics become more and more important, as broadcast stations increase.

Measures adopted in general in order to ameliorate interference elimination characteristics are to use a narrow band pass filter. FIG. 1 represents construction of a prior art superheterodyne receiver provided with such a kind of filters.

In the figure, the reference numeral 1 represents an antenna; 2, 4 and 7 are filters; 3 is a high frequency amplifier; 5 is a frequency converter; 6 is a local oscillator; 8 is an intermediate frequency amplifier; 9 is a demodulator; 10 is an audio amplifier; and 11 is a loudspeaker.

Consider now interference elimination characteristics for a receiver constructed as described above. It is not possible to expect too much of frequency discrimination characteristics of the antenna 1. If high frequency signals received by this antenna are amplified as they are by the high frequency amplifier 3, harmful phenomena, such as intermodulation and cross modulation, are produced by nonlinear effects of the amplifier. Therefore a filter 2 is connected in the stage following the antenna 1.

Since the frequency converter 5 is essentially a non-linear circuit, and besides intermodulation and cross modulation, image frequency interferences come into question, frequency discrimination characteristics, which are insufficient by the filter 2, are complemented by the filter 4. The reference numeral 6 represents a local oscillator.

The filter 7 discriminates signals converted into intermediate frequency.

As mentioned above, in a prior art receiver, filter means divided into three are used.

In the case where the received frequency is variable, the following constructions have been used for the filters 2 and 4:

(a) construction whose central frequency is variable;

(b) construction in which filters having different central frequencies are commuted; and (c) construction of wide band pass type, through which signals pass for a variable band region.

Since the filter means of construction (c) are not essentially of narrow band pass type, they are not so good as the others in interference characteristics. The filter means of construction (b) have a narrow pass band and can be used to some extent, but too many filters are necessary and they come into question in cost and space. For the filter means of construction (c) it is not possible to obtain frequency discrimination characteristics to suppress satisfactorily other than signals to be obtained.

When the filter means of construction (a) are used and satisfactory discrimination characteristics are to be obtained, the number of stages of filter should be increased. However, in this case, loss increases. Specifically in the case where a filter of this construction is used as abovementioned filter 2, since it influences the noise figure of a receiver and also tracking error of filter comes to question, it is not possible to increase too much the number of stages.

Therefore, in order to suppress interference in neighboring channels, a filter 7 for discrimination of intermediate frequency signals is disposed in the stage following the frequency converter 5. Since for this filter the central frequency can be fixed and frequency can be low, it can be expected that a filter, which is cheap and has good frequency discrimination characteristics, is used.

As discussed above, it is obvious that frequency discrimination of the filters 2 and 4 is insufficient with respect to intermodulation and cross modulation caused by the high frequency amplifier 3 and the frequency converter 5.

The mechanism of generation of the intermodulation will be explained hereinbelow.

Supposing that received frequency is fd and that there are interfering waves of frequency $fd \pm \Delta f$ and $fd \pm 2\Delta f$, it can be seen that, in the high frequency amplifier, from a third order non-linear term, fd is produced as follows;

$$2(fd \pm \Delta f) - (fd \pm 2\Delta f) = fd$$

and causes interference. $\Delta f$ varies, depending on the kind of communication, but it can be an order of 10 kHz.

In order to eliminate such an interference, it is necessary to use a high frequency filter capable to suppress satisfactorily frequency components, which are extremely close to the frequency to be received. But, as such a filter, there have been only piezo-electric filters, whose central frequency is fixed and uses quartz and so forth, and it has a disadvantage that it can have only the construction (b), because their central frequency is fixed.

In order to eliminate this disadvantage, it has been proposed a receiver having an excellent interference elimination characterisitcs and a high sensitivity, by using as filter in the receiver a filter having a variable central frequency at high frequencies, a small loss and a good discrimination, consisting of a surface elastic wave amplifier working by parametric amplification effect.

FIG. 2 shows an example of superheterodyne receivers as described above, and the same reference numerals mean circuits identical or analoguous to those in FIG. 1. In FIG. 2, the reference numeral 12 represents a surface elastic wave amplifier; 13 is a circuit generating pumping electric power; 14 is a circuit applying DC bias to the amplifier; and 15 and 16 are matching circuits connected respectively to one of transducers for the surface elastic wave amplifier, which will be described hereafter.

FIG. 3 represents an example of construction of the surface elastic wave amplifier. In the figure, S is a semiconductor substrate made of silicon (Si) and so forth; I is a piezo-electric film made of zinc oxide (ZnO) and so forth; and I' is a silicon oxide (SiO$_2$) film. The semiconductor substrate S, the silicon oxide film SiO₂, and the piezo-electric film I form a laminate.

The above-mentioned silicon oxide film I' acts as film stabilizing the surface of the semiconductor substrate.

The reference numerals $12_1$ and $12_2$ are respectively input and output means of electric signals. These consist of surface elastic wave transducers comprising comb form electrodes, which are connected respectively to one of the matching circuits 15 and 16 mentioned above. At the input means $12_1$ electric signals are transformed into surface elastic waves and at the output means $12_2$ the surface elastic waves are transformed into electric signals.

Further the reference numeral $M_1$ is an electrode for applying DC bias voltage and pumping electric power to the amplifier. This electrode $M_1$ is disposed on the propagation path of surface signal waves.

The reference numeral $M_2$ is an electrode for forming an ohmic contact to be grounded on the semiconductor substrate S.

The above described electrode $M_1$ is grounded successively through a choke coil CH for preventing high frequency current and through a variable voltage DC source 14 for applying DC bias voltage to the amplifier.

On the other hand the above-mentioned same electrode $M_1$ is grounded successively through a condenser C for preventing DC current and through a high frequency source 13 for supplying pumping electric power. Electric signals input from the matching circuit 15 to the input means $12_1$ is transformed into surface wave signals, and propagate in a surface portion of the piezo-electric film I towards the output means $12_2$. Suppose that, in an example, frequency of propagating surface wave signals is f.

Then, when pumping electric power of frequency 2f is supplied from the high frequency source 13 to the electrode $M_1$ on the piezo-electric film I together with DC bias voltage from the DC source 14, surface wave signals are amplified by parametric interaction effect due to nonlinear characteristics of the capacitance of the surface charge layer in the surface portion of the semiconductor substrate S beneath the electrode $M_1$ and surface wave signals thus amplified are transformed into electric signals by the output means $12_2$ and taken out.

Amplification factor by the above described amplification depends on the length of the electrode $M_1$ in the surface wave propagation direction, the strength of nonlinearity $\xi$ in the surface portion of the semiconductor substrate, the frequency of pumping electric power, etc., and it is possible to vary the amplification factor by varying these values.

The above-mentioned strength of non-linearity $\xi$ is determined by the non-linearity of the capacitance of the surface charge layer of the semiconductor substrate, which in turn depends on the value of DC bias voltage, and the magnitude of pumping electric power. In practice, the amplification factor is adjusted principally by varying the above-mentioned two kinds of parameters.

As explained above, in the surface elastic wave amplifier 12, its amplification factor is determined by the non-linearity of the capacitance of the surface charge layer in the surface portion of the semiconductor substrate made of silicon and so forth, and since this non-linear effect is much greater than that obtained by utilizing the nonlinear effect of the piezo-electric layer itself shown above as prior art, it has an advantage that pumping electric power can be reduced in order to obtain a predetermined amplification factor.

On the other hand, since parametric amplification effect of the surface elastic wave amplifier 12 is a kind of positive feedback effect, in order to increase the amplification factor, it is necessary to increase electric Q. FIG. 4 shows an example of the frequency response of the amplification factor to the variation of Q. As it is clearly seen in this figure, since frequency pass band width can be varied together with variations of the amplification A due to increase of Q shown by a dotted line, variable band width amplification effect is also obtained.

As described above, since a surface elastic wave amplifier 12 can be used as high frequency amplifier having a high gain and an excellent frequency discrimination as well as a variable tuning by supplying an adequote DC bias voltage and pumping electric power (in order to obtain a variable tuning, it is necessary only that the frequency of pumping electric power is twice as high as the received frequency), the prior art filters 2 and 4, and the high frequency amplifier 3 can be replaced by a surface elastic wave amplifier 12.

Moreover, since the amplifier has a good discrimination, it is possible to suppress frequency components which are too close to be separated by the prior art variable tuning type and to prevent harmful phenomena which are produced in the prior art high frequency amplifier and frequency converter, such as intermodulation and cross modulation.

Further, since the mechanisms of amplification of the surface elastic wave amplifier is parametric amplification, the amplifier has a low noise level and the sensitivity is ameliorated.

Besides these advantages, it is not necessary that the filter 7 used in the intermediate frequency stage has high performance.

As discussed above, a receiver using a surface elastic wave amplifier has a high sensitivity and excellent interference elimination characteristics and when the surface elastic wave amplifier has a great amplification factor, it has a great Q. This fact means that, even if the frequency band occupied by signals to be received is narrow and amplification factor of the surface elastic wave amplifier is great, the signals can be received without any problem, if spectrum of the signals to be received is within the pass band. However, when frequency band occupied by the signals is wide and exceeds the pass band of the surface elastic wave amplifier, quality of reception is worsened. For example, in the FM broadcast wave, the occupied frequency band width amounts to 200 kHz for stereo broadcast. On the other hand, the pass band width of a surface elastic wave amplifier having a sufficiently great amplification factor is from several kHz to several tens kHz. Consequently it is obvious that a good reception is not possible, using a receiver constructed as described above.

As discussed above, heretofore, procedures such as FM negative feedback techniques and tracking filter, etc. have been utilized in order to receive FM waves; by using elements having narrow band pass filter characteristics (most of them are passive elements having no amplification). All of them aim to ameliorate sensitivity and interference elimination characteristics. FIGS. 5 and 6 show representative examples of the construction of these circuits.

FIG. 5 shows a prior art receiver according to the FM negative feedback system. In the figure, the reference numeral 21 is an antenna; 22 is a high freqency amplifier; 23 is a frequency converter; 24 is a local oscillator; 25 is a narrow band pass filter, 26 is an intermediate frequency amplifier; 27 is a frequency dicriminator; 28 is an audio amplifier; and 29 is a loud-speaker.

On the other hand, FIG. 6 represents an example using a tracking filter. In the figure, 31 is a phase shifter; 32 is a phase comparator; and 33 is a low pass filter.

A characteristic feature of the example shown in FIG. 5 is that the local oscillator 24 is a voltage control type oscillator (VCO) and that output of the frequency discriminator 27 is used as control voltage for it. The loop 23→25→26→27→24→23 constitutes a frequency negative feedback loop, and the local oscillator 24 oscillates so that it follows momentary displacements of frequency. Consequently, at the output of the frequency converter 23, frequency deviation with respect to the output of the high frequency amplifier 23 decreases, and it results that spectrum of signals to be received can pass amply the narrow band pass filter 25.

A characteristic feature of the example shown in FIG. 6 is that the narrow band pass filter 25 is a filter whose central frequency is capable to be controlled by voltage and that signals filtered by the low pass filter 33 of phase error signals obtained by phase comparison in the phase comparator 32 of output signals obtained from the filter 25 through the phase shifter 31 and output signals of the filter 25, can be used as control signals for this filter.

This is a technique analoguous to PLL (Phase Locked Loop), and output of the filter 33 can be demodulation output as it is.

In the above, two representative examples according to the prior art technique have been shown. Their disadvantage is that intermodulation interference takes place in the high frequency amplifier and the frequency converter and that both the constructions have no function to suppress it.

OBJECT OF THE PRESENT INVENTION

The object of this invention is to eliminate these disadvantages and remove the obstacles in the reception such as intermodulation interference, provoked in the high frequency amplifier and the frequency converter and to provide an FM receiver having a high sensitivity and a high fidelity.

SUMMARY OF THE INVENTION

In order to attain the above object, according to the present invention, there is provided a receiver comprising at least two output means taking out electric signals corresponding to sound waves progagating in different disposed in the high frequency amplifier stage, wherein phase difference or frequency difference between outputs of said output means is detected and frequency of pumping electric power applied to said surface elastic wave amplifier is controlled in response to output thus detected.

This invention will be described more in detail, referring to examples shown in the drawing, in which:

BRIEF DESCRIPTION OF THE DRAWINGS

FIG. 8 is a bloc diagram showing another example according to this invention.

DESCRIPTION OF THE PREFERRED EMBODIMENTS

Figure 1:
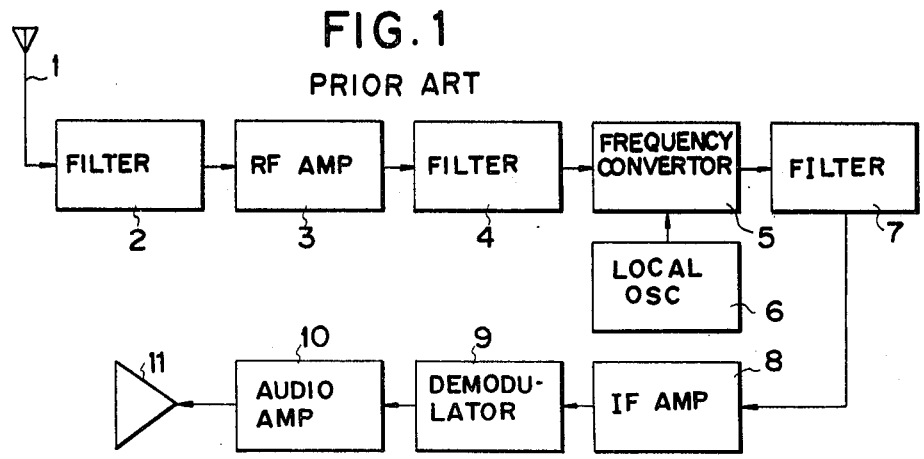
FIG. 1, FIG. 5, and FIG. 6 are respectively a bloc diagram showing an example of a prior art superheterodyne receiver.
Figure 2:
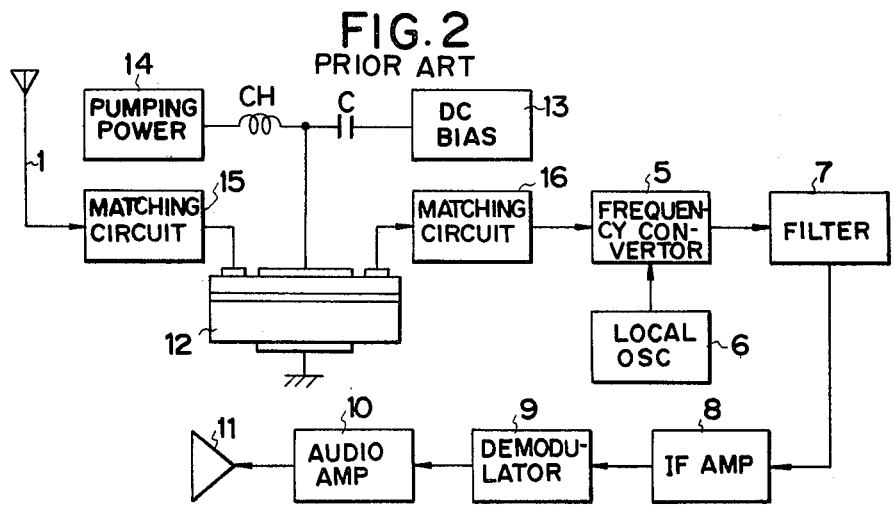
FIG. 2 is a bloc diagram showing an example of a prior art receiver using a surface elastic wave amplifier.
Figure 3:
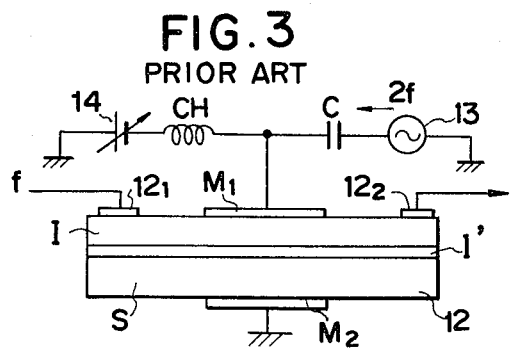
FIG. 3 is a circuit diagram representing an example of the construction of a surface elastic wave amplifier, which can be used for the above-mentioned receiver.
Figure 4:
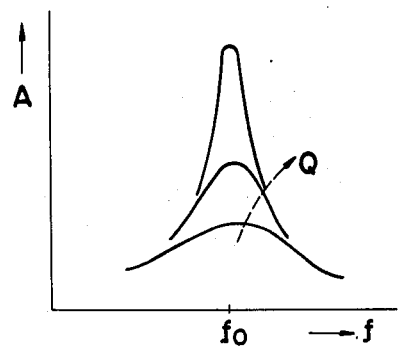
FIG. 4 represents frequency characteristic curves.
Figure 5:
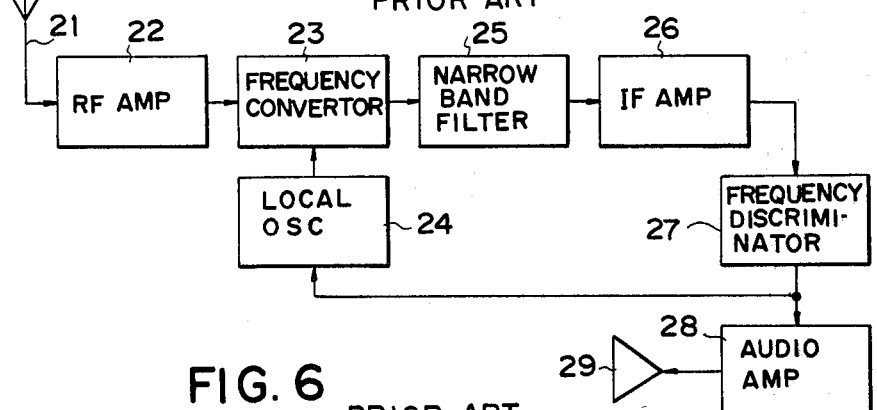
Figure 6:
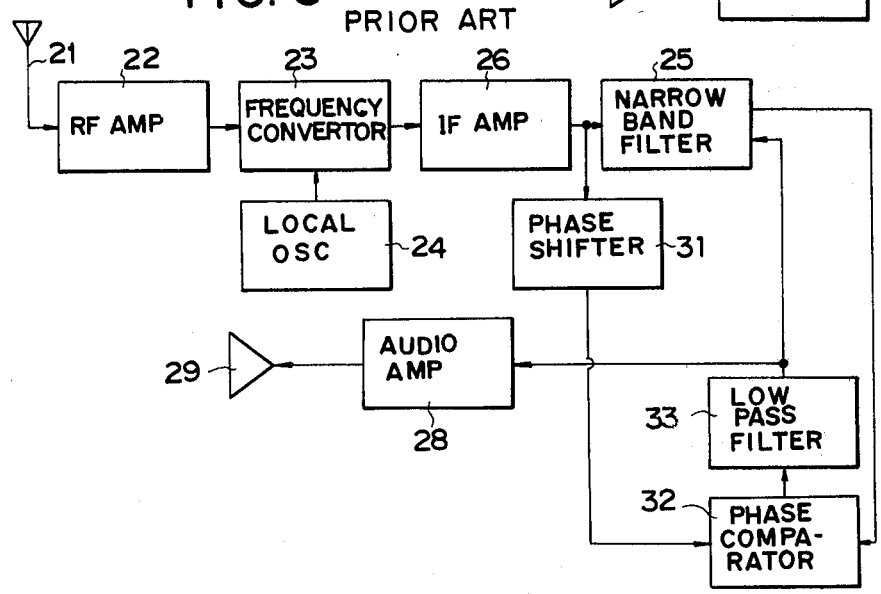
Figure 7:
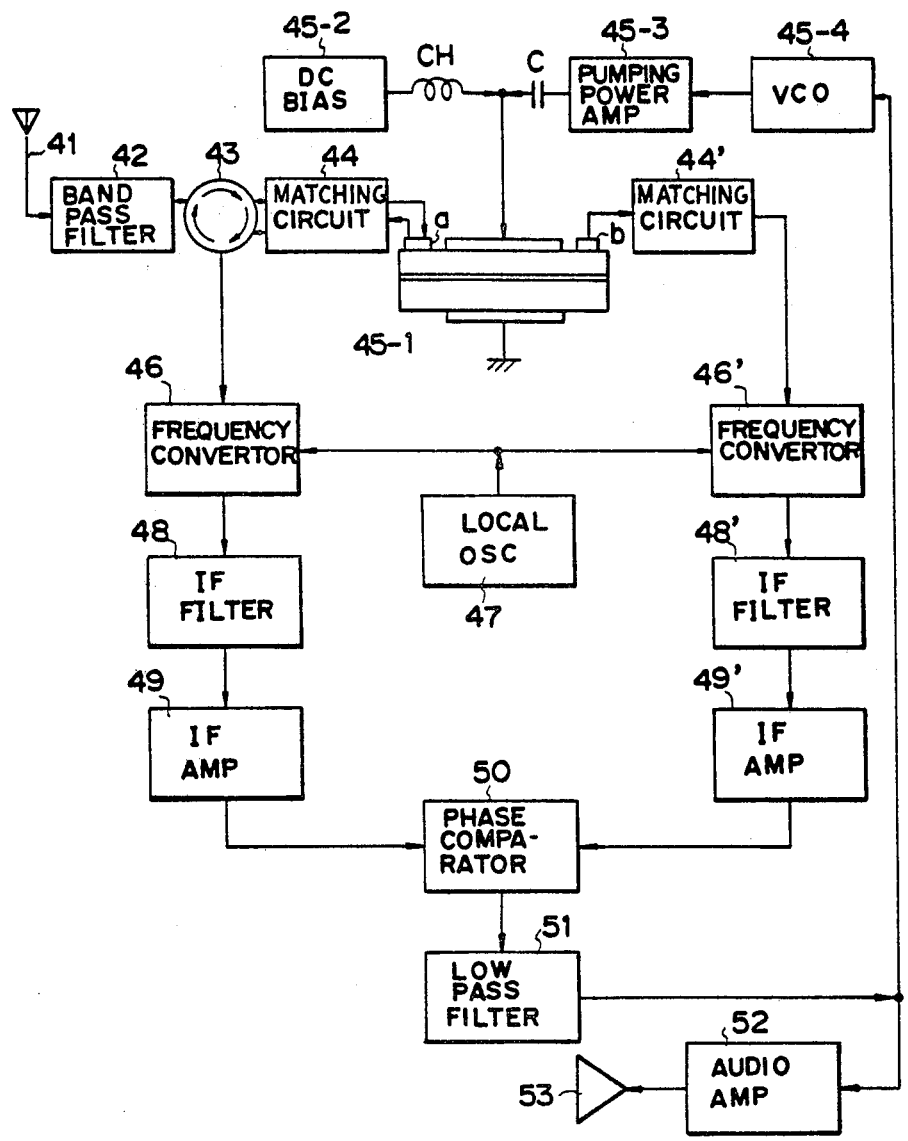
FIG. 7 is a bloc diagram showing an example according to this invention.

In FIG. 7, 41 is an antenna; 42 is a pre-band-pass-filter; 43 is a circulator; 44, 44' are matching circuit; 45-1 is a surface elastic wave amplifier; 45-2 is a DC bias application circuit; 45-3 is a pumping power amplifier; 45-4 is a voltage control type oscillator (VCO); CH is a choke; C is a condensor; 46, 46' are frequency converters; 47 is a local oscillator; 48, 48' are intermediate frequency filters; 49, 49' are intermediate frequency amplifiers; 50 is a phase comparator; 51 is a low pass filter; 52 is an audio amplifier; and 53 is a loud-speaker. Suppose now that frequency of signals to be received is fs. Signals coming from the antenna 41 consist of many frequency components, among which only those within a necessary band can be taken out through the pre-band-pass-filter 42 (for example, for Japanese FM broadcast, 76-90 MHz). Output signals of the filter 42 pass through the circulator 43, and are applied through the matching circuit 44 to the left transducer a of the surface elastic wave amplifier 45-1. Sound waves propagating from the left transducer a to the right transducer b are amplified and appear in the form of electric signals again at the right transducer b. Suppose now that frequency of pumpng signals is fp. The frequency of the waves propagating from left to right is fs independently of fp. At the same time, sound waves propagating from right to left are produced, and their frequency fi is equal to fp−fs. If fp=2fs, fi=2fs−fs=fs. Consequently frequencies of the waves propagating in both the directions are equal to fs. In this case, sound waves propagating in both the directions have the greatest amplification factor. In the case where momentary frequency is function of time, i.e. fs(t), as for FM, pumping frequency fp is also function of time, i.e. fp(t), and between them the following relation should be valied;

$$fp(t) = 2fs(t) \ldots \quad (1)$$

The working manner of the amplifier will be explained for the case where the equation (1) is not valied, that is, $$fp(t) \neq 2fs(t) \ldots \quad (2)$$

$$fs(t) \neq fi(t) \ldots \quad (3)$$

$$fi(t) - fs(t) = \Delta f(t) \ldots \quad (4)$$

$$(\Delta f(t) \neq 0) \ldots \quad (5)$$

output fs(t) appearing at the right transducer b is led through the matching circuit 44' to the frequency transducer 46'. Output fi(t) appearing at the left transducer a is led through the matching circuit 44 to the circulator 43. Since the circulator doesn't allow signals coming from the antenna 41 to pass towards the frequency converter 46, but transmit signals coming from the matching circuit 44 to the frequency converter 46, components of fi(t) can be effectively taken out. At the frequency converters 46 and 46', the frequencies are converted by the common output of the local oscillator 47 and frequencies thus obtained pass through the intermediate frequency filters 48, 48' and the intermediate frequency amplifiers 49, 49'. It is evident that the difference between the frequencies at their outputs is equal to Δf(t) given by the equation (4). That is, according to this invention, the circuit according to the so-called superheterodyne system consisting of the frequency converter 46, 46' and the local oscillator 47 is not essential.

The two intermediate frequency signals having momentary frequency difference f(t) are compared in phase by the phase comparator 50 and phase error signals are obtained at its output. As well known for the working manner of PLL, they can be considered as frequency error signals. These frequency error signals are led through the low pass filter having a desired transmission function to the voltage control type oscillator (VCO) 45-4 generating pumping power. If $$fp(t) > 2fs(t) \ldots \quad (6)$$

$$fi(t) = fp(t) - fs(t) > fs(t) \ldots \quad (7)$$

$$\Delta f(t) = fi(t) - fs(t) > 0, \ldots \quad (8)$$

the polarity of the phase comparator 50 or the voltage control type oscillator 45-4 should be such that it reduces the output frequency of the oscillator 45-4. If $$\Delta f(t) < 0, \ldots \quad (9)$$

the polarity should be, of course, such that it increases the output frequency of the voltage control type oscillator 45-4 and it results that a kind of frequency negative feedback loop is formed so that $$\Delta f(t) \to 0. \ldots \quad (10)$$

After all the equation (1) is valied. Since harmful interfering wave components, which are output with fi(t) and fs(t) are effectively attenuated by the surface elastic wave amplifier 45-1, intermodulation inteference and so forth caused by the frequency converter 46, 46' are considerably ameliorated, and besides the fact that amplification principle of the surface elastic wave amplifier is parametric amplification, owing to reduction of the equivalent noise band width due to the narrow band tracking filter, the reception threshold is lowered. In this manner a FM receiver having a high sensitivity can be constructed.

FIG. 8 shows another example according to this invention. In the figure the same reference numerals represent respectively a circuit having the same function as in FIG. 7.

In the case represented by this figure, only sound waves propagating from right to left in the piezo-electric substrate are taken out to the transducer B owing to the multistrip coupler M and to the transducer D only sound waves propagating from left to right are taken out. Owing to this fact, thus construction has an advantage that no expensive circulator is necessary on the outside. Moreover transducers I, B and D are, of course, not limited to be of normal type, but they can be of apodized type or one-directional type transducer. P is a pumping electrode.

The construction of the surface elastic wave amplifier is not limited to those described above. Further, this invention can be applied not only to FM reception but also satellite communication, for which it is necessary to receive signals by following them, those frequency varies for example by Doppler displacement.

As explained above, according to this invention, it is possible to provide a receiver having interference elimination characteristics and a high sensitivity and also to reduce cost, because filters used in the intermediate frequency stage have not necessarily high performance.

I claim:

1. Receiver comprising the following means:
    a surface elastic wave amplifier disposed in the high frequency amplifier stage of said receiver;
    at least two output means taking out electric signals corresponding to sound waves propagating in different directions in response to input signals in said surface elastic wave amplifier;
    detection means detecting phase errors or frequency errors of electric output signals of said output means;
    means applying pumping electric power to said surface elastic wave amplifier; and
    control means controlling the frequency of said pumping electric power in response to output of said detection means.

2. Receiver according to claim 1, wherein said detection means consists of two sets of superheterodyne circuit, each of them being coupled to each of said output means and a phase comparator, to which intemediate frequency signals of each of said sets of circuit are applied.

3. Receiver according to claim 1, wherein said means applying pumping electric power comprises a voltage control type oscillator, said oscillator being controlled by said control means.

4. Receiver according to claim 1, wherein one of said output means comprises a circulator.

5. Receiver according to claim 1, wherein a band pass filter is disposed in the stage preceeding said circulator.

6. Receiver according to claim 1, wherein said surface elastic wave amplifier is provided with a multistrip coupler.

* * * * *

UNITED STATES PATENT AND TRADEMARK OFFICE
CERTIFICATE OF CORRECTION

PATENT NO. : 4,426,732

DATED : January 17, 1984

INVENTOR(S) : Masaharu MORI

It is certified that error appears in the above-identified patent and that said Letters Patent is hereby corrected as shown below:

Column 5, line 49; after "different" insert ---directions in response to input signals to a surface elastic wave amplifier---.

Column 6, line 41; change "valied" to ---valid---.

Column 7, line 7; change "f(t)" to ---$\Delta f(t)$---.

Column 8, line 12; change "those" to ---whose---.

line 20; delete "the following means".

line 21; change "the" to ---a---.

line 23; after "signals" insert ---from said surface elastic wave amplifier---.

line 25; change "in" (second occurrence) to ---to---.

line 28; after "of" (first occurrence) insert ---said---.

line 33; before "output" insert ---an---.

line 37; change "cuit" to ---cuits---.
change "each" (last occurrence) to ---respective ones---.

line 38; change "intemediate" to ---intermediate---.

line 39; change "circuit" to ---circuits---.

UNITED STATES PATENT AND TRADEMARK OFFICE
CERTIFICATE OF CORRECTION

PATENT NO. : 4,426,732

DATED : January 17, 1984

INVENTOR(S) : Masaharu MORI

It is certified that error appears in the above-identified patent and that said Letters Patent is hereby corrected as shown below:

Column 8, line 44; change "control type" to ---controlled---.

line 48; change "claim 1" to ---claim 4---.

Signed and Sealed this

Tenth Day of July 1984

[SEAL]

Attest:

GERALD J. MOSSINGHOFF

Attesting Officer

Commissioner of Patents and Trademarks